United States Patent
Orrico et al.

(10) Patent No.: US 6,965,085 B1
(45) Date of Patent: Nov. 15, 2005

(54) PUSH-BUTTON SWITCH (75) Inventors: Mario M. Orrico, Chicago, IL (US); Michael S. Pedersen, Des Plaines, IL (US); Brian J. Truesdale, Plainfield, IL (US)

(73) Assignee: Illinois Tool Works Inc., Glenview, IL (US)

( * ) Notice: Subject to any disclaimer, the term of this patent is extended or adjusted under 35 U.S.C. 154(b) by 1 day.

(21) Appl. No.: 10/982,025

(22) Filed: Nov. 4, 2004

(51) Int. Cl.[7] .............................................. H01H 9/00
(52) U.S. Cl. .............................. 200/314; 300/61.45 M; 300/524
(58) Field of Search ......................... 200/314, 61.45 M, 200/520–525, 341, 329; 335/205–207; 338/32 H, 338/12

(56) References Cited

U.S. PATENT DOCUMENTS

| | | | | |
|---|---|---|---|---|
| 3,051,810 A | * | 8/1962 | Wahlstrom | ................. 200/457 |
| 4,080,523 A | * | 3/1978 | de Loisy | .................... 200/314 |
| 4,514,608 A | * | 4/1985 | Murata | ....................... 200/524 |
| 4,968,860 A | * | 11/1990 | Shinohara et al. | .......... 200/314 |
| 5,077,454 A | * | 12/1991 | Lorenzo | .................... 200/573 |
| 5,727,675 A | * | 3/1998 | Leveque et al. | ............ 200/524 |
| 6,504,122 B2 | * | 1/2003 | Yu | ............................. 200/524 |

* cited by examiner

Primary Examiner—K. Lee
(74) Attorney, Agent, or Firm—Mark W. Croll; Paul F. Donovan (57) ABSTRACT

A push-button switch includes a universal assembly comprising a single body design, a single plunger design, and a single base design to provide various switch options in an overall single package design. The push-button switch of the invention may be operated by either a mechanical switch assembly or a hall-effect system. The push-button switch may also provide a momentary switch connection, such as a single push system, or a maintained switch connection, such as a push-push system. Further, the push-button switch may include feedback mechanisms, such as LED components and the like that provide a visible feedback of the switch connection, and tactile feedback components that also indicate the switch connection.

21 Claims, 10 Drawing Sheets

PUSH-BUTTON SWITCH

FIELD OF THE INVENTION

The present invention relates generally to switches and, more particularly, to push-button switches that can be used with various controls, equipment, and other applications.

BACKGROUND OF THE INVENTION

Push-button switches are known. Push-button switches are used in various applications such as industrial equipment control handles, outdoor controls, and medical equipment, to name a few. Typically, push-button switches are used to either close or open an electrical circuit depending on the application. For example, with one known type of push-button switch, when the button is pressed, the circuit will close and will stay closed while the button is pressed. Upon the release of the button, the circuit will open. To close the circuit again, the button will need to be re-pressed. These types of switches provide a momentary on/off operation as the button is pressed and released.

A known version of the momentary push-button switch uses a mechanical switch assembly that includes a conductive member, such as a conductive bar, that is coupled to the button. In use, when the button is pressed, the bar is caused to come into contact with a pair of spaced-apart electrical switch terminals mounted to the switch body. Once in contact, the circuit between the switch terminals closes and will remain closed as long as the button remains pressed. Upon the release of the button, the conductive bar will move away from the terminals, thereby opening the circuit. While it is common for this type of momentary switch to close the circuit when the button is pressed, it is also known to provide a momentary push-button switch that opens the circuit between the terminals when the button is pressed. Moreover, although momentary switches described above are common, it is also known to provide a push-button switch that maintains a connection with one action and then changes the connection with another action (e.g., push-push action). With this maintained connection switch, pressing and releasing the button closes the circuit between the terminals, and pressing and releasing the button a second time opens the circuit. Similarly, the maintained connection switch may be configured to open the circuit upon pressing and releasing the button, while pressing and releasing the button a second time closes the circuit.

In another known version of the push-button switch, rather than a mechanical switch operation, a hall-effect, integrated circuit is used. In the hall-effect version, the conductive bar of the mechanical version is replaced with a magnet. The magnet is located within a plunger that is positioned within the switch body. The plunger is operatively connected to the button. The magnet cooperates with a hall-effect chip that is also positioned within the switch body and is electrically connected to the switch terminals. As known in the art, the hall-effect magnet and chip functionally provide the on/off operation of the switch.

Still another known version of the push-button switch includes the use of a light-emitting diode (LED). The LED is typically not associated with the switching operation, rather is provided as a desired indicator means. In other words, the LED will sense or detect when the switch is open or closed and will transmit a light signal to indicate such condition.

Typically, push-button switches are attached to a matching component or surface by way of a snap mount, thread mount, or surface mount.

The known push-button switches, however, have certain drawbacks. As described above, many different switch designs exist. These various switch designs have varying uses and applications. Because of the various switch designs and applications, multiple parts and components are required resulting in significant costs and assembly time. It is therefore desirable to provide a simplified, universal push-button switch assembly that reduces the total number of parts, yet still provides the desired design options that are currently available. The present invention is directed at providing such a push-button switch.

SUMMARY OF THE INVENTION

The present invention is directed to a push-button switch having a universal assembly including a single body design, a single plunger design, and a single base design to provide various switch options in an overall single package design. The push-button switch may be operated by a mechanical system or a hall-effect system, and also provide a momentary switch connection, such as a single push system, or a maintained switch connection, such as a push-push system. Moreover, the present invention may include feedback mechanisms, such as LED components and like sensors to provide a visible feedback of the switch connection, and may include tactile feedback components that provide a tactile feedback of the switch connection.

Other features and advantages of the invention will become apparent to those skilled in the art upon review of the following detailed description, claims and drawings in which like numerals are used to designate like features.

Before the embodiments of the invention are explained in detail, it is to be understood that the invention is not limited in its application to the details of construction and the arrangement of the components set forth in the following description or illustrated in the drawings. The invention is capable of other embodiments and of being practiced or being carried out in various ways. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof.

DETAILED DESCRIPTION OF THE EMBODIMENTS

Referring to the figures there is depicted a push-button switch 10 of the present invention. The push-button switch 10 may be used with numerous applications, such as equipment control handles, outdoor controls, medical equipment, and the like. The push-button switch 10 may be operated by a mechanical system or a hall-effect system, as described below, and provide a momentary switch connection, such as a single push system, or a maintained switch connection, such as a push-push system, also as described below. In addition, the push-button switch 10 may include an LED and accompanying components, along with tactile feedback features and other switch options. With the present invention, a single push-button switch 10 can therefore accommodate all of the foregoing parts and components to provide numerous desirable switch features and options, thereby making the push-button switch 10 applicable for numerous desired applications. One skilled in the art will understand and appreciate the numerous other possible uses and applications for the push-button switch 10.

Referring to FIGS. 1–5, in an exemplary embodiment, the push-button switch 10 includes generally a body 12, a base 14, a button 16, a bezel 18, and a removable bezel adapter 20. The body 12 and base 14 are configured to contain the numerous internal components of the push-button switch 10, as discussed below. The body 12 defines an opening 22 in a first end 24 for receiving and mounting the base 14. Also mounted to the first end 24 is the removable bezel adapter 20, which is threaded onto the first end 24. The body 12 also defines a second end 26 on which is mounted the button 16. Also mounted at the second end 26 over the button 16 is the bezel 18, which snap-fits over the second end 26. The bezel 16 is positioned around the periphery of the button 16. As illustrated, the bezel 18 defines a ring shape with a circular opening to match the circular shape of the button 16. It should be understood, however, that other shapes of buttons and bezels may be used with the present invention.

Figure 1:
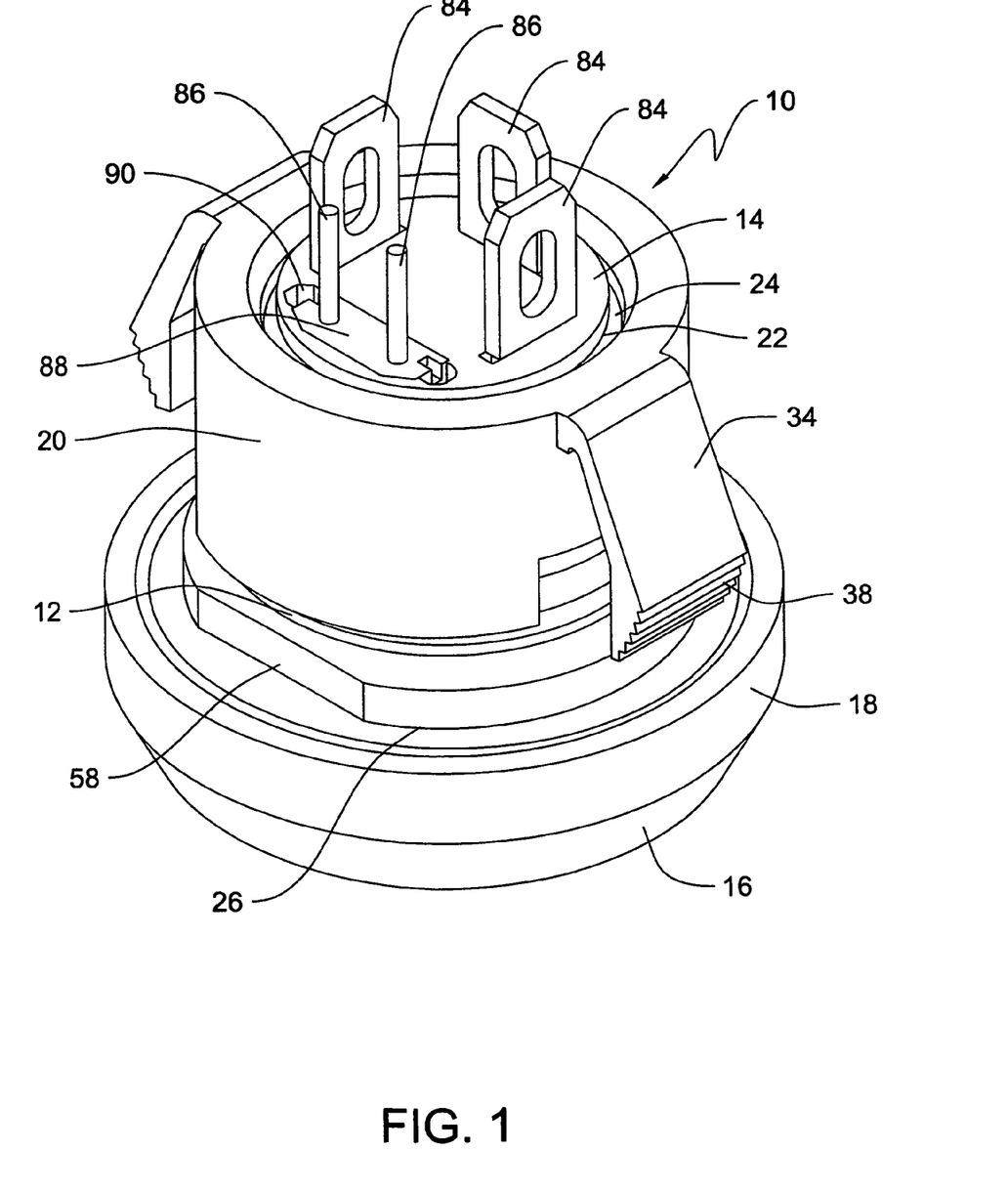
FIG. 1 is an isometric view of the push-button switch of the present invention.
Figure 2:
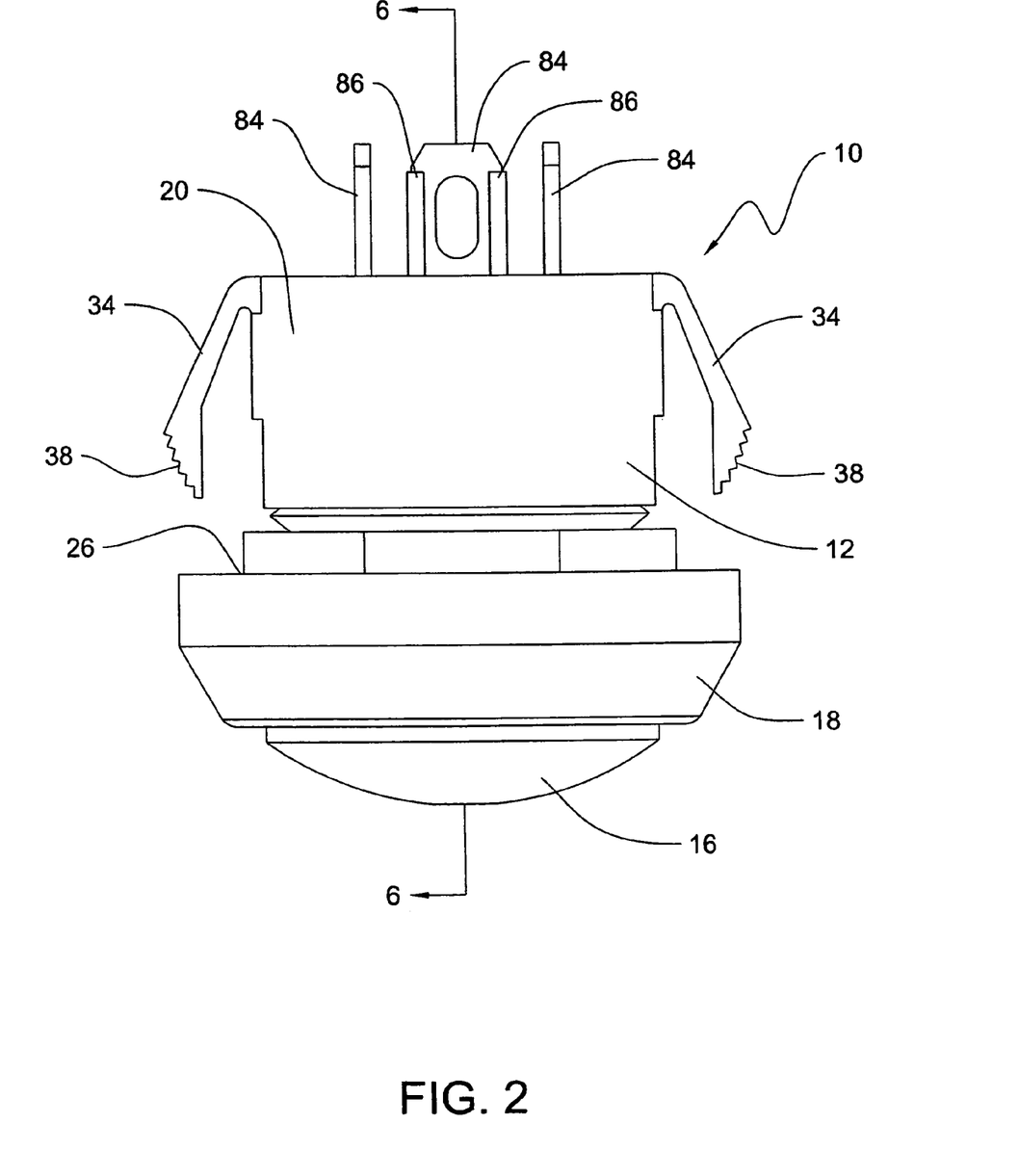
FIG. 2 is a side elevation view of the push-button switch of FIG. 1.
Figure 3:
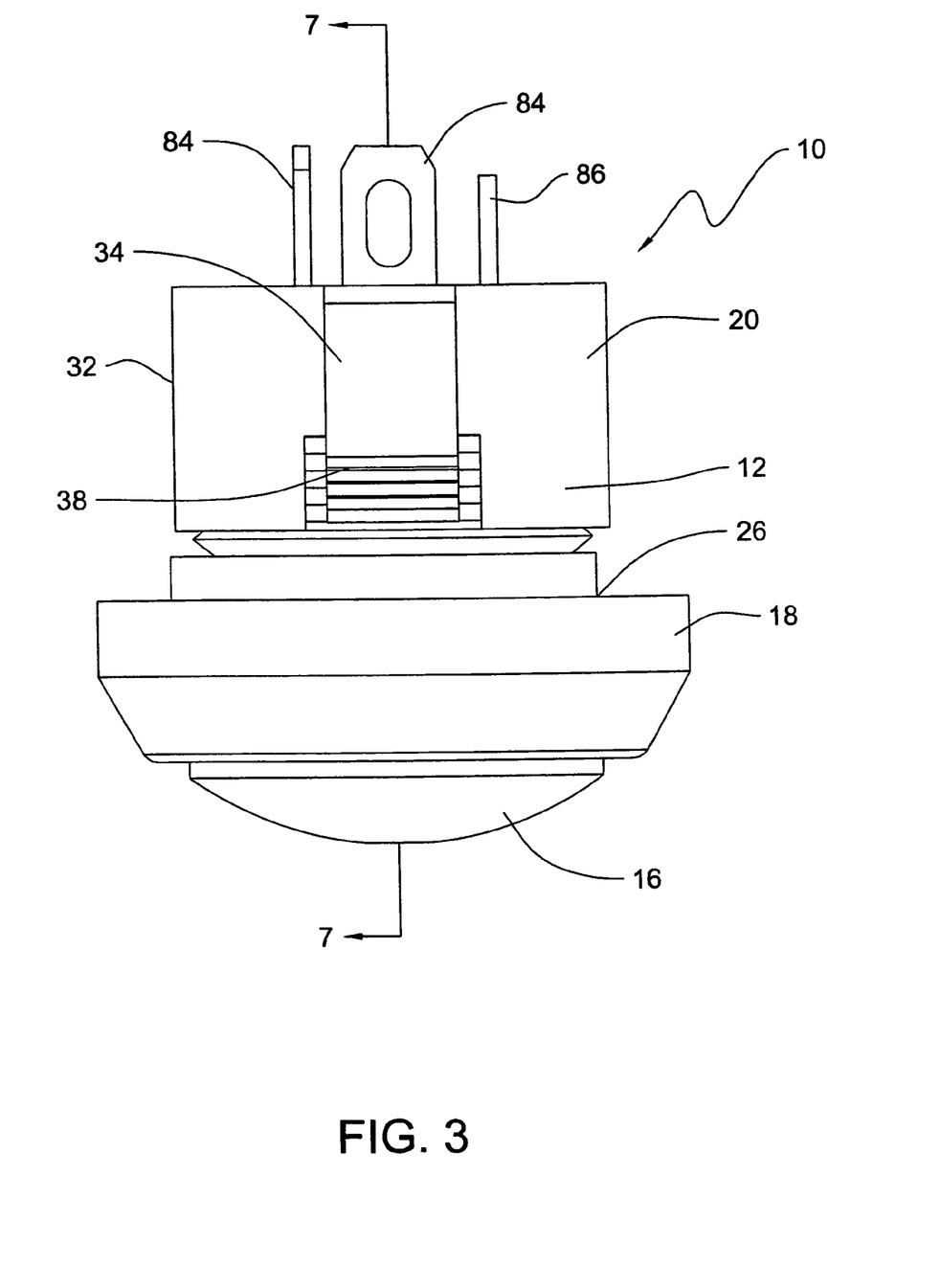
FIG. 3 is another side elevation view of the push-button switch of FIG. 1.
Figure 4:
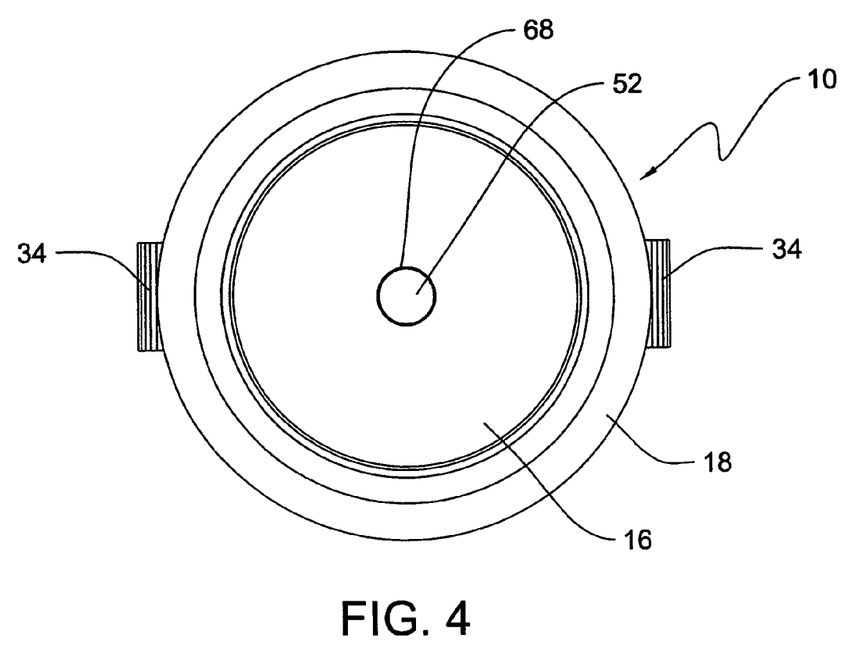
FIG. 4 is a top plan view of the push-button switch of FIG. 1.
Figure 5:
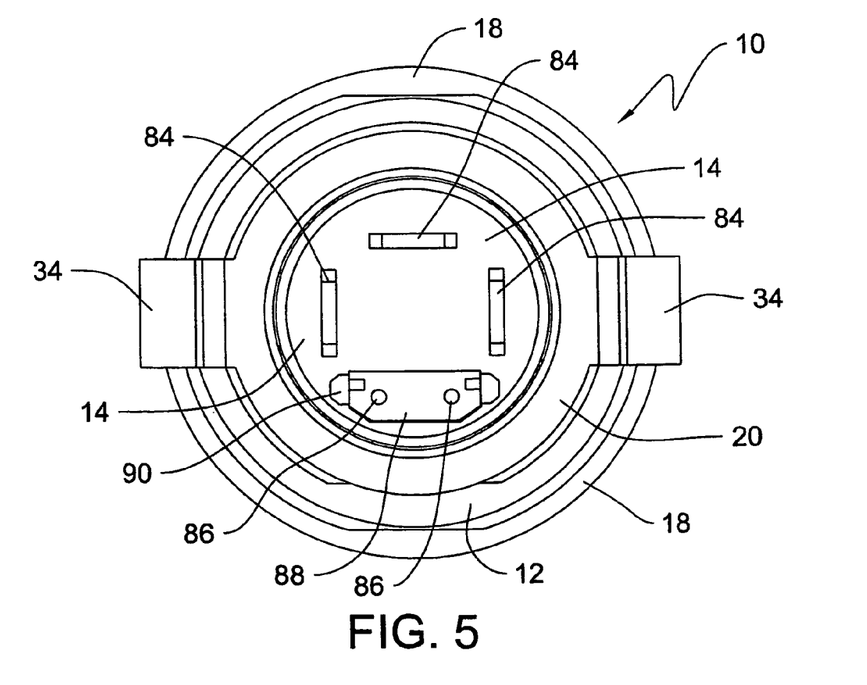
FIG. 5 is a bottom plan view of the push-button switch of FIG. 1.
Figure 7:
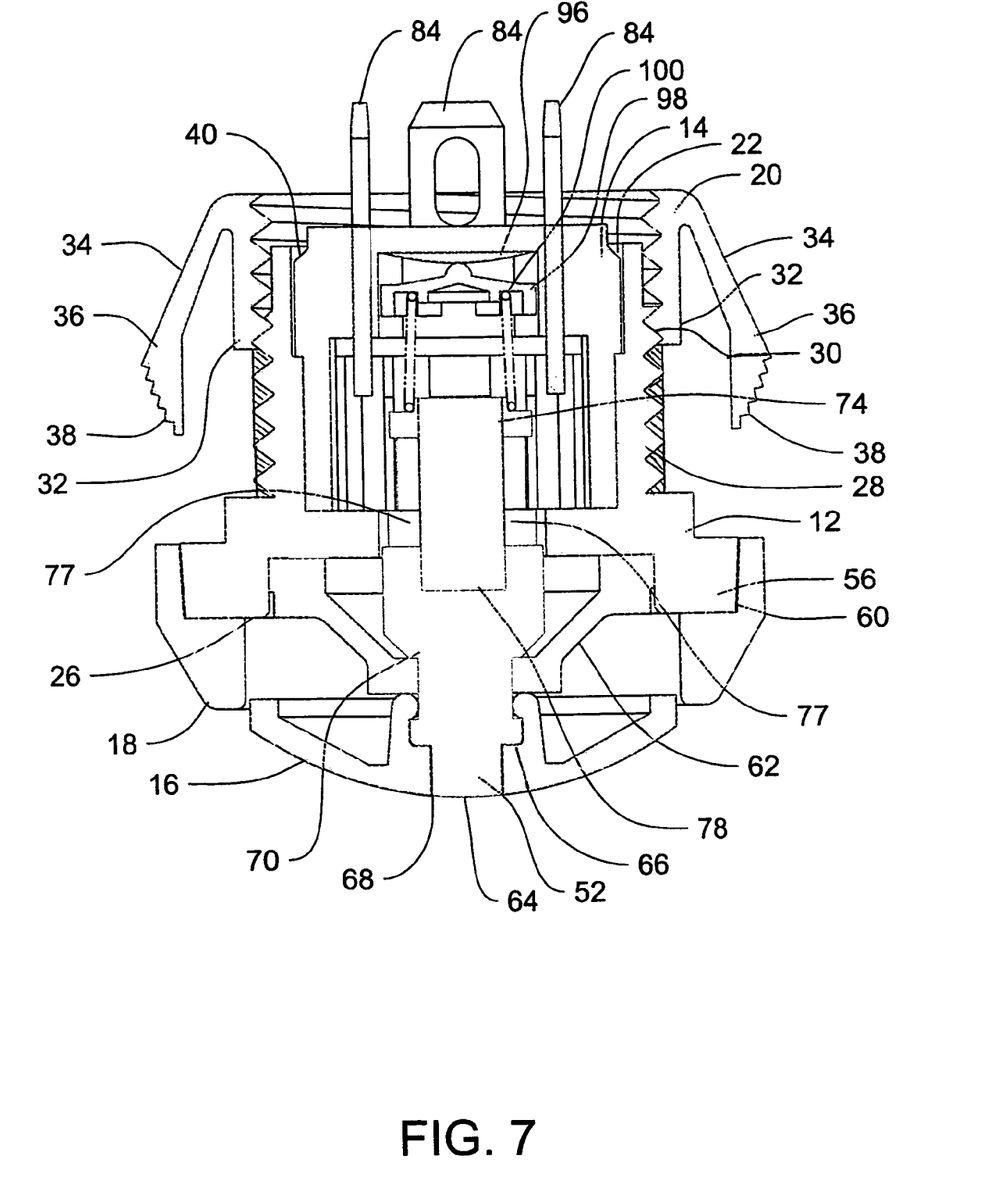
FIG. 7 is cross-section view of the push-button switch of FIG. 3 taken at line 7—7.

Referring to FIGS. 1, 2 and 7, the body 12 is generally cylindrical shaped and defines a threaded exterior 28 at the first end 24. The bezel adapter 20, which has a mating threaded interior 30, is threaded onto the threaded exterior 28 of the body 12 and serves to secure the push-button switch 10 to an associated device or mounting surface, not shown. The bezel adapter 20 defines a cylindrical body having a smooth exterior surface 32. Extending outwardly from the exterior surface 32 are flexible flanges or fingers 34 that serve to snap-fit the push-button switch 10 to a mating opening in the associated device or mounting surface, thereby securing the push-button switch 10 to the associated device or mounting surface. The flanges 34 further define flange ends 36 that include ridges 38 to assist in securing the push-button switch 10 to the associated device or mounting surface by providing a gripping surface that engages the surface of the associated device or mounting surface. In other words, as the bezel adapter 20 is passed through the mating opening, the flexible flanges 34 will flex inward and toward the exterior surface 32 and will flex back to their original position once the flanges 34 have fully passed through the opening. At this point, the flanges 34 engage the back wall of the mounting surface and prevent the push-button switch 10 from being pulled out of the opening. The ridges 38 on the flange ends 36 will provide a gripping surface to further assist in preventing the push-button switch 10 from being removed from the mating opening. In an alternative configuration, because the bezel adapter 20 is threadably mounted to the body 12, the bezel adapter 20 may be removed and the body 12 with its threaded exterior surface 28 may be mounted directly to the associated device or mounting surface without the use of the bezel adapter 20.

Figure 11:
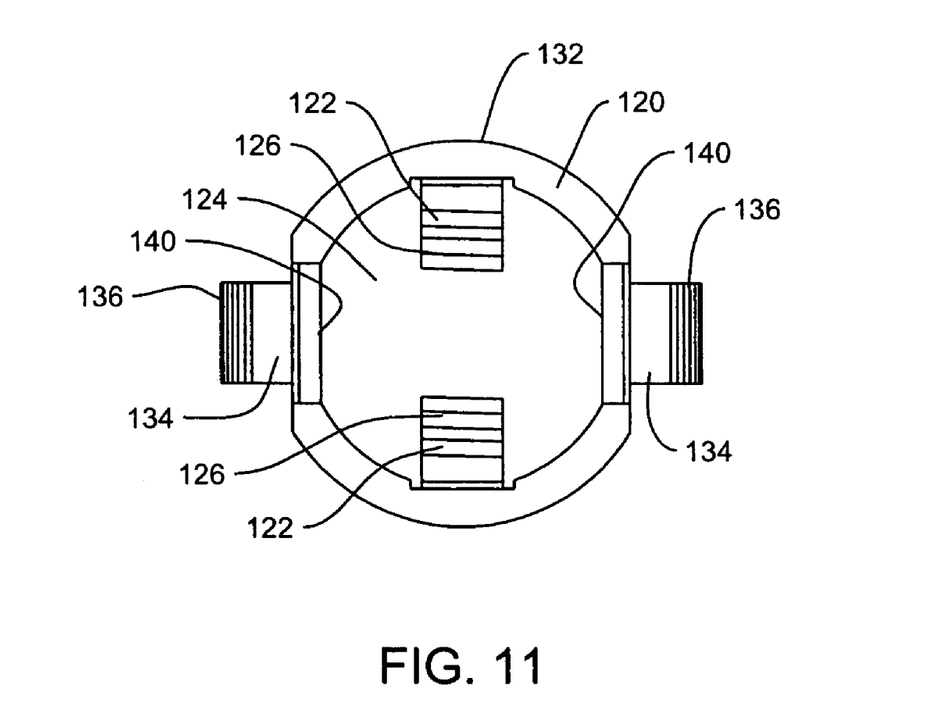
FIG. 11 is a top plan view of the adapter of FIG. 10.
Figure 12:
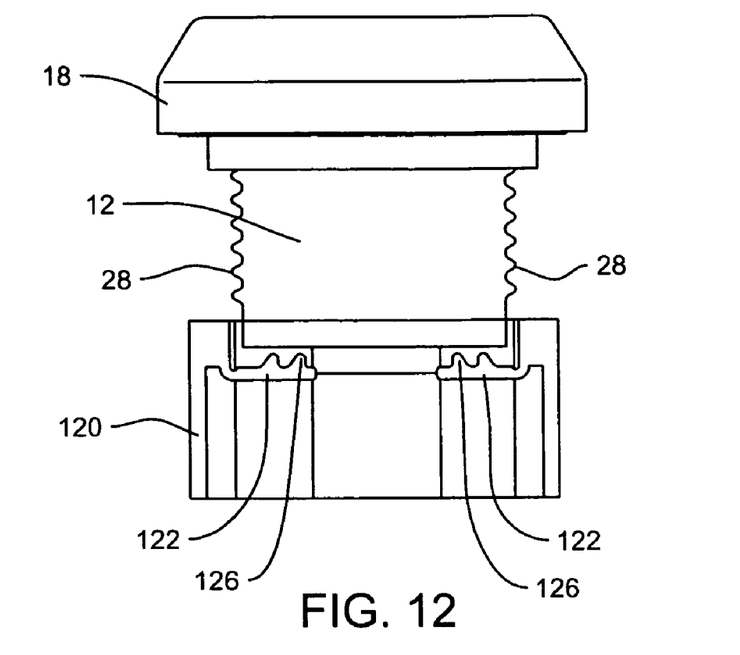
FIG. 12 is a side elevation view of the adapter of FIG. 10 prior to assembly with an exemplary push button body of the invention.
Figure 13:
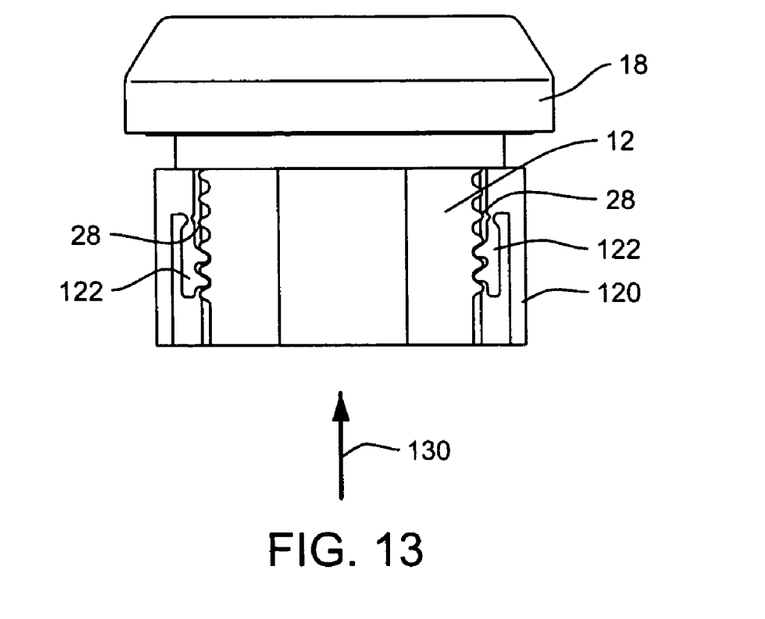
FIG. 13 is a side elevation view of the assembly of the adapter and push button body of FIG. 12.

Referring to FIGS. 10–13, in another exemplary embodiment of the bezel adapter, a bezel adapter 120 is illustrated and defines opposing barbed members 122 that extend into the interior 124 of the adapter 120. The barbed members 122 define barbed ends that further include a series of ridges or barbs 126. As illustrated by FIGS. 12 and 13, during assembly, the adapter 120 will be aligned with the body 12, and specifically the threaded exterior 28 of the body 12, and pushed onto the body 12 and across the threaded exterior 28, as indicated by direction arrow 130. The barbed members 122 will ride across the threaded exterior 28 and will engage or dig into the threaded exterior 28 (FIG. 13) preventing the adapter 120 from backing up from threaded exterior 28, thereby securing the adapter 120 to the body 12. Similar to the above embodiment, the adapter 120 defines a cylindrical body having a smooth exterior surface 132. Extending outwardly from the exterior surface 132 are flexible flanges or fingers 134 that serve to snap-fit the adapter 120 to a mating opening in the associated device or mounting surface. In addition, the flanges 134 further define flange ends that include ridges 136 to assist in securing the adapter 120 to the associated device or mounting surface by providing a gripping surface that engages the surface of the associated device or mounting surface. As illustrated in FIG. 11, the adapter 120 may include opposing interior flat surface walls 140 that can be used to key or align the body 12 into the adapter 120. That is, the surface walls 140 may align and mate with matching exterior surface walls on the body 12 to provide a more secure fit between the adapter 120 and the body 12.

Figure 6:
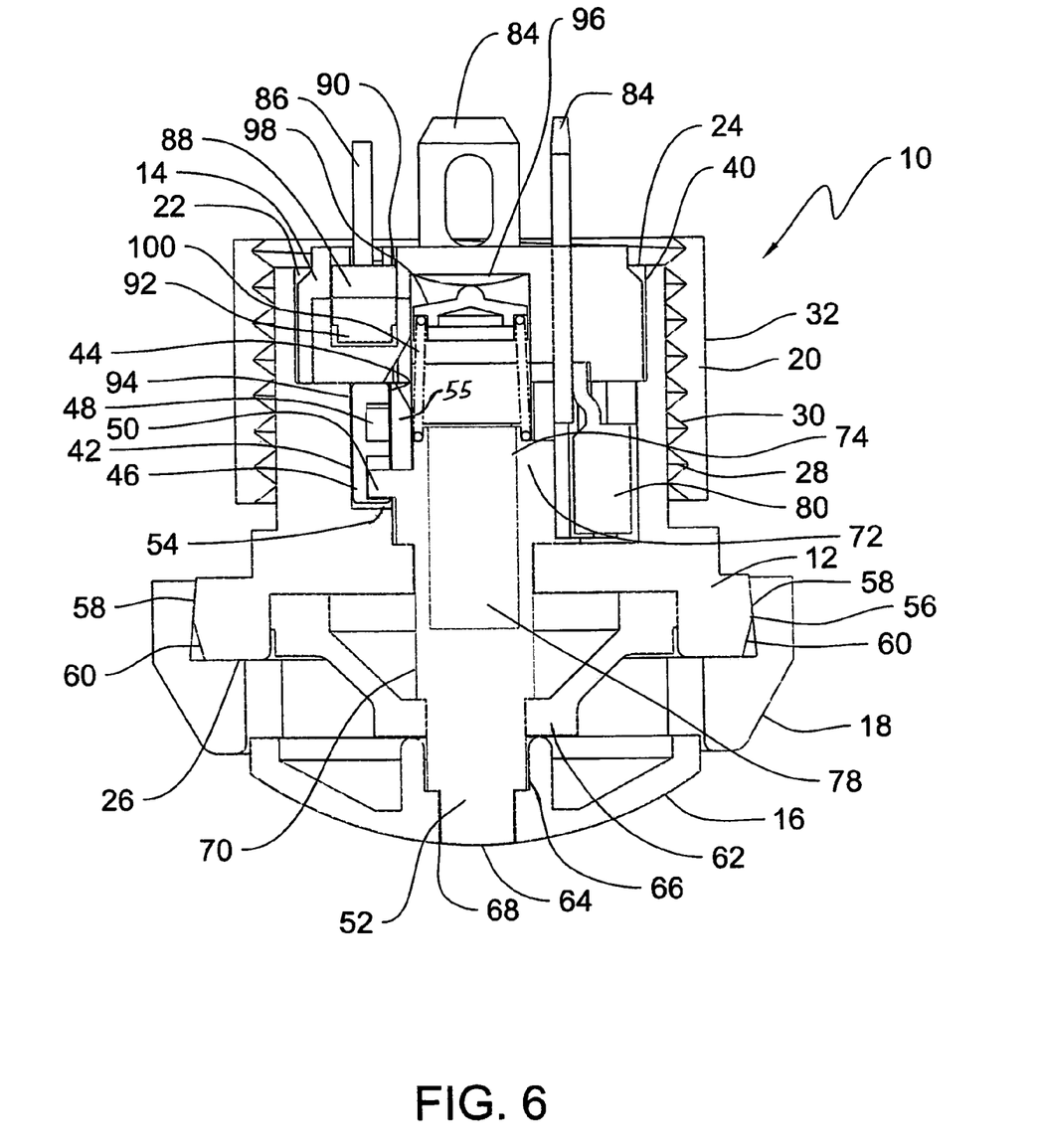
FIG. 6 is a cross-section view of the push-button switch of FIG. 2 taken at line 6—6.

As illustrated in FIG. 6, the body 12 defines an inner cylindrical portion 40 that is adapted to receive the base 14. The base 14 is mounted to the inner portion 40 of the body 12 through the opening 22. To secure the base 14 to the body 12, heat can be applied to bond the parts together. One skilled in the art will understand that other mechanical and/or chemical arrangements could be utilized to secure the base 14 to the body 12. The inner portion 40 further defines a pair of oppositely facing, spaced-apart wall members 42, 44. The wall members 42, 44 extend longitudinally within the inner portion 40 and serve to position and hold a cam 46. If a maintained connection for the push-button switch 10 is desired, that is, a push-push operation, the cam 46 is used to enable this push-push operation of the system and to provide the maintained connection.

Figure 8:
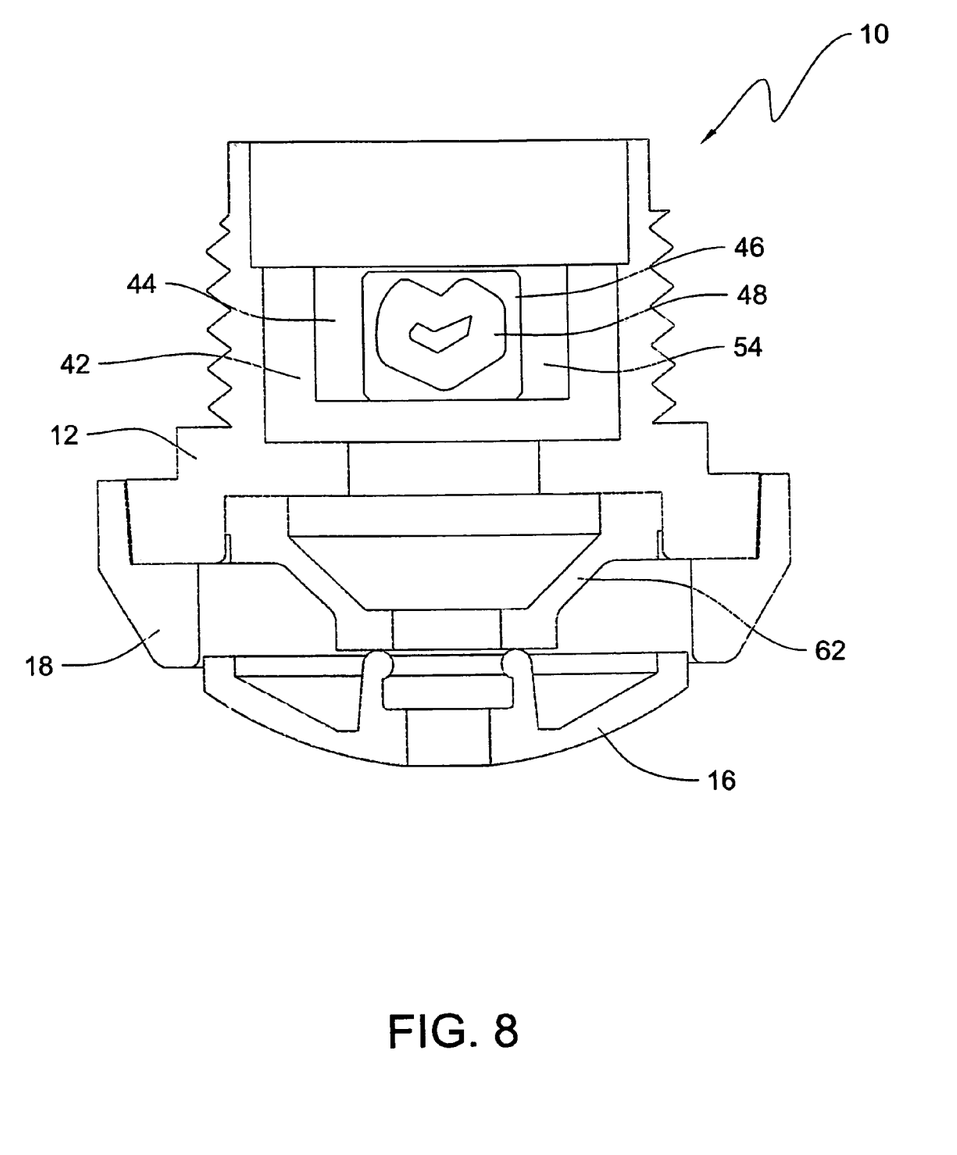
FIG. 8 is a partial cross-section view of the push-button switch illustrating the cam of the present invention.

As illustrated by FIGS. 6 and 8, the cam 46 includes a cam slot or track 48 that assists in providing the push-push operation. In an exemplary embodiment, the cam track 48 defines a v-shaped slot. As discussed below, a projecting member 50, which is operatively connected to a plunger 52, which, in turn, is operatively connected to the button 16, will engage with and follow the cam slot or track 48 as the button 16 is pressed. Formed in the wall member 42 is a pocket or slot 54 or opening to provide access to the cam 46. The pocket 54 permits the projecting member 50 of the plunger 52 to extend through the slot 55 and, if a cam 46 is used, to engage the cam 46 to facilitate the push-push operation of the system. The cam 46 is permitted to move laterally with respect to the slot 55 as the projecting member 50 is moved with the plunger in the up and down directions, that is, longitudinally within the inner portion 40 and guided by slot 55. To ensure the cam 46 remains between the associated wall members 42, 44 upon final assembly, the base 14 is positioned over the cam 46, thereby holding the cam 46 in position.

For a momentary connection, or single push operation, the cam 46 is not used and the projecting member 50 will simply extend through the slot 55 and into pocket 54. When the button 16 is pressed and the plunger 52 is moved, the projecting member 50 will move in the up and down directions within the slot 55 and pocket 54.

Referring to FIGS. 6 and 7, the body 12 also includes a head 56 located at the second end 26. The head 56 is generally circular in shape and defines opposing non-circular surfaces 58. Each of the non-circular surfaces 58 includes beveled surfaces 60 to permit the bezel 18 to be snap-fitted onto the head 56 and held in position on the head 56. That is, the beveled surfaces 60 are angular surfaces to assist in holding the bezel 18 to the head 56. One skilled in the art will readily appreciate that the head 56 may include various configurations depending on the design and shape of the bezel 18, such as, for example, a round or square shaped bezel.

Referring to FIGS. 6–8, a resilient rubber member 62 is positioned between the button 16 and the body 12 at the second end 26 of the body 12. The rubber member 62 is circular in shape and has a dome-like profile that serves to bias the button 16 in a desired direction, or in the case of the illustrated embodiment, in the direction away from the body 12. That is, in operation, as the button 16 is pressed, the rubber member 62 will compress permitting movement of the button 16, and accompanying plunger 52, toward the body 12. Upon the release of the button 16 by the user, the rubber member 62 will return to its original shape, thereby biasing the button 16 to its original position. The rubber member 62 may define other configurations and designs and yet provide the desired biasing of the button 16.

Referring to FIGS. 6 and 7, a plunger 52 is operatively connected to the button 16 and is centrally positioned within the inner cylindrical portion 40 of the body 12. The plunger 52 is adapted to move within the body 12 and will move within the body 12 upon a user pressing the button 16. The plunger 52 defines a first end 64 that mounts to a receptor 66 formed on the inside of the button 16 and that extends through a mating opening 68 in the button 16. The illustrated mating opening 68 is centrally positioned on the button 16. The plunger 52 further defines a cylindrical body 70 and a second end 72. The second end 72 further defines a hollow interior 74 formed in the plunger cylindrical body 70. The hollow interior 74 of the plunger 52 is adapted to contain switch components such as a hall-effect magnet or a mechanical switch assembly.

Referring to FIG. 6, if a hall-effect switch assembly is desired, in an exemplary embodiment, a magnet 78 is positioned within the hollow interior 74 of the plunger 52. The magnet 78 is generally configured to match the shape of the hollow interior 74 of the plunger and may be press-fit, or secured through other techniques, to the hollow interior 74. As known in the art, the magnet 78 will cooperate with a hall-effect chip 80 that is positioned within the body 12. As discussed below, the hall-effect chip 80 defines legs that are connected to switch terminals 84.

Figure 9:
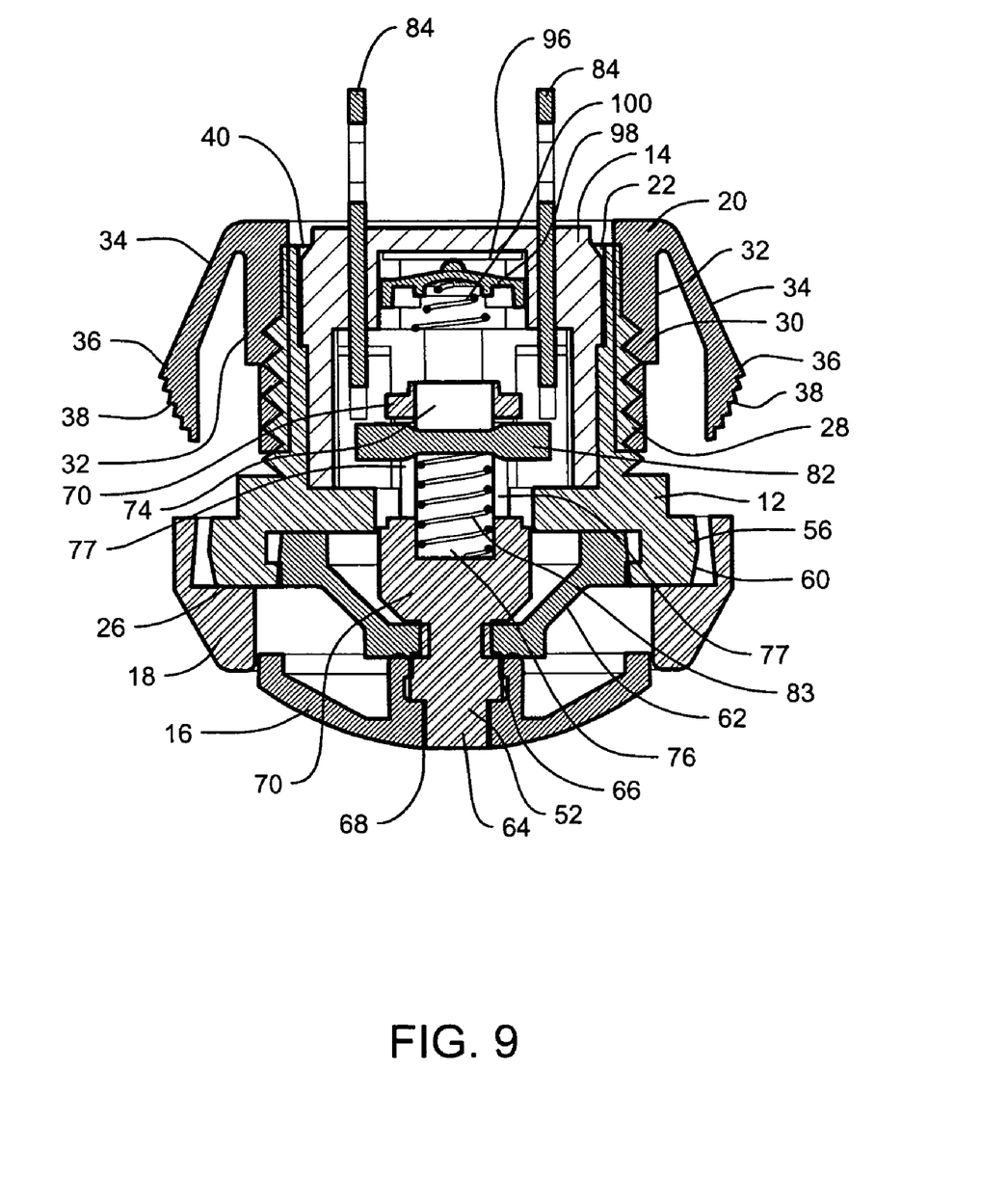
FIG. 9 is a cross-section view of an alternative configuration of a push-button switch of the present invention taken at line 7—7.
Figure 10:
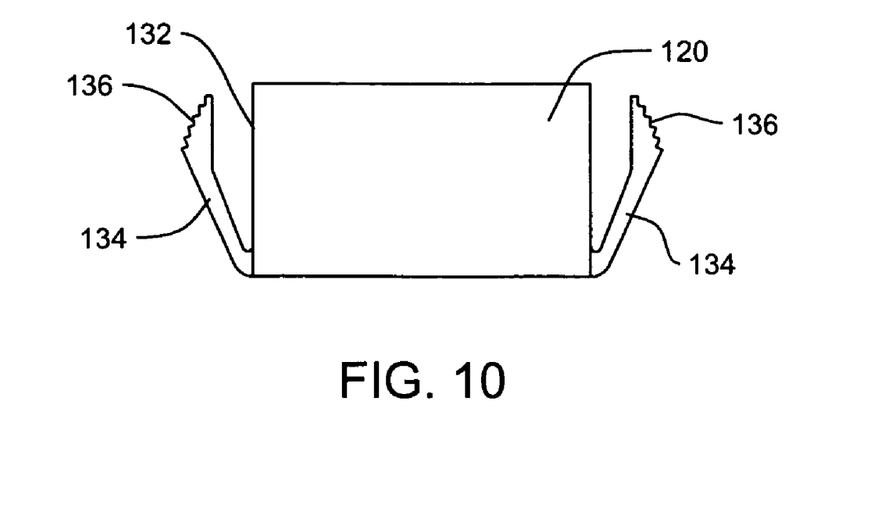
FIG. 10 is a side elevation view of an alternative embodiment of an adapter of the present invention.

Referring to FIG. 9, in another exemplary embodiment, if a mechanical switch assembly is desired, the hollow interior 74 of the plunger 52 is adapted to hold a conductive bar 82, preferably made of metal or other conductive material. The bar 82 is mounted transversely across the hollow interior 74 through slots 77 in opposing sides of the plunger 52 body. The ends of the bar 82 will extend outwardly of the plunger body 70 on both side of the plunger 52. In use, upon the user pressing the button 16, the bar 82 will come in contact with opposing switch terminals 84 to create an electrical connection between the terminals 84, thereby closing the circuit between the terminals 84. To ensure a positive connection between the terminals 84, a spring 83 may be positioned within the hollow interior 74 of the plunger 52 to bias the bar 82 in the direction toward the terminals 84.

The plunger 52 is preferably made of a clear plastic or similar transparent material so as to function as a light pipe in those assemblies and configurations that utilize an LED or similar position indicators. That is, the light transmitted from the LED or other indicators will transmit through the clear plunger 52 and will illuminate through the opening 68 in the button 16. It should be understood that the plunger 52 can be clear or transparent, or can be any other desirable color.

As illustrated in FIG. 6, the plunger 52 is also adapted to include the projecting member 50 extending outwardly from the exterior surface of the plunger 52 to cooperate with a push-push assembly for a maintained connection. That is, the projecting member 50 extends outwardly from the plunger 52, through the slot 55 in the pocket 54 adjacent to wall 42 of the body 12, and into engagement with the cam track 48. In use, as the button 16 is pressed, the projecting member 50 will engage and follow the cam track 48 to achieve the push-push operation of the system. Significantly, with the present invention, a single plunger 52 design can accommodate all of the foregoing options.

Referring to FIGS. 1, 2, 6 and 7, the base 14 is configured to hold electrical switch terminals 84. The terminals extend outwardly from the base 14 and also into the hollow interior 40 of the body 12. The terminals 84 are conventional and typically two terminals 84 are used with each push-button switch 10. However, in an alternative embodiment, if a hall-effect is desired, three terminals 84 may be placed in the base 14. With this configuration, the hall-effect chip 80 is positioned within the base 14 and each leg of the hall-effect chip 80 may be formed and welded to an associated terminal 84. To complete the hall-effect, as stated above, centrally positioned within the plunger 52 is the hall-effect magnet 78. Again, the magnet 78 cooperates with the chip 80 to provide the on/off operation of the push-button switch 10, as known in the art.

Referring to FIGS. 1 and 6, in another alternative embodiment, if an LED is desired with the push-button switch 10, LED terminals 86 may be molded to a plastic component 88 that, in turn, is mounted to an opening 90 in the base 14. The LED terminals 86 are operatively connected to an LED 92. The LED 92 may be any known LED suitable for mounting to a push-button switch. The LED 92 is typically soldered to the terminals 86, preferably by a surface mount process, to provide the operative connection. To complete the LED assembly, a lens 94 is configured below the LED 92 and positioned within the body 12. In use, the LED assembly will function as an indicator of the operation of the push-button switch 10 upon the user pressing the button 16. As stated above, the light emitted from the LED 92 will transmit through the plunger 52 and will be seen through the opening 68 in the button 16. If an LED is not desired with the push-button switch 10, the LED assembly is removed and either the opening 90 in the base 14 is left open or, alternatively, the opening 90 is covered with a mating plastic piece configured similar to the plastic component 88 for holding the LED terminals 86.

In yet another alternative embodiment, referring to FIGS. 6 and 7, the base 14 may be configured to provide a tactile feedback when the button 16 is pressed. In this embodiment, the base 14 is configured to hold a snap-dome 96 and spring cup 98. One end of a spring 100 is attached to, or may be positioned adjacent to, the plunger 52 and the other end of the spring 100 seats within the spring cup 98. The snap-dome 96, which is made of a thin metal material, is placed between the spring cup 98 and the bottom of the base 14. When the button 16 is pressed, the plunger 52 comes into contact with and pushes on the spring 100, which biases the spring cup 98, which ultimately (when the button is fully depressed) pushes on the snap-dome 96 to provide an audible clicking sound to indicate the switch is activated, or deactivated as the case may be. The spring cup 98 is permitted to move slightly in the assembled position. Thus, the single base 14 design of the invention can accommodate all of the foregoing options.

Variations and modifications of the foregoing are within the scope of the present invention. It should be understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention. The claims are to be construed to include alternative embodiments to the extent permitted by the prior art.

Various features of the invention are set forth in the following claims.

What is claimed is:

1. A push-button switch comprising:
   a body defining a first end, a second end, a hollow interior, and opposing walls positioned within the hollow interior, one of the opposing walls defining a slot,
   a base mounted to the first end of the body,
   a cam mounted between the opposing walls of the body,
   a button operatively connected to the body at the second end,
   a resilient member positioned between the button and the body, and
   a plunger mounted to the button and extending into the hollow interior of the body, the plunger defining a hollow interior and a projecting member extending outwardly from the plunger, through the slot, and into engagement with the cam, the hollow interior of the plunger adapted to receive a hall-effect magnet, and adapted to receive a conductive bar.

2. The push-button switch as set forth in claim 1, further comprising a bezel positioned around the button and mounted to the body.

3. The push-button switch as set forth in claim 2, further comprising a bezel adapter threaded onto the body, the bezel adapter further comprising flexible fingers for mounting the push-button switch to a mounting surface.

4. The push-button switch as set forth in claim 3, further comprising a tactile feedback mechanism positioned between the base and the plunger, the tactile feedback mechanism including a spring, a spring cup, and a snap done.

5. The push-button switch as set forth in claim 4, further comprising a light emitting diode removably mounted to the base.

6. The push-button switch as set forth in claim 5, further comprising a plurality of switch terminals mounted to the base and extending into the hollow interior of the body.

7. The push-button switch as set forth in claim 6, further comprising a hall-effect magnet positioned within the hollow interior of the plunger, and a hall-effect chip positioned within the base and operatively connected to the switch terminals.

8. The push-button switch as set forth in claim 6, further comprising a conductive bar positioned within and transversely extending across the hollow interior of the plunger, the conductive bar selectively movable into contact with the terminals.

9. The push-button switch as set forth in claim 6, wherein the plunger is transparent and extends through an opening in the button.

10. The push-button switch as set forth in claim 9, wherein the cam further defines a cam track, and wherein the projecting member operatively engages the cam track.

11. The push-button switch as set forth in claim 9, further comprising a light-emitting diode lens positioned within the hollow interior of the body and operatively coupled to the light-emitting diode.

12. A push-button switch comprising:
    a body defining a first end, a second end, a hollow interior, and opposing walls positioned within the hollow interior, one of the opposing walls defining a pocket or slot,
    a base mounted to the first end of the body,
    a plurality of switch terminals mounted to the base,
    a button operatively connected to the body at the second end, the button defining an opening,
    a resilient member positioned between the button and the body,
    a transparent plunger mounted to the opening in the button and extending into the hollow interior of the body, the plunger defining a hollow interior and a projecting member extending outwardly from the plunger, the hollow interior of the plunger adapted to receive a hall-effect magnet, and adapted to receive a conductive bar,
    a cam mounted between the opposing walls of the body, the cam defining a cam track, wherein the projecting member extends through the slot and into engagement with the cam track,
    a light-emitting diode removably mounted to the base and operatively connected to light-emitting diode terminals, and
    a light-emitting diode lens positioned within the hollow interior of the body and operatively coupled to the light-emitting diode.

13. The push-button switch as set forth in claim 12, further comprising a bezel positioned around the button and mounted to the body.

14. The push-button switch as set forth in claim 13, further comprising a bezel adapter threaded onto the body, the bezel adapter further comprising flexible fingers for mounting the push-button switch to a mounting surface.

15. The push-button switch as set forth in claim 14, further comprising a tactile feedback mechanism positioned between the base and the plunger, the tactile feedback mechanism including a spring, a spring cup, and a snap dome.

16. The push-button switch as set forth in claim 12, further comprising a hall-effect magnet positioned within the hollow interior of the plunger and a hall-effect chip positioned within the base and operatively connected to the switch terminals.

17. The push-button switch as set forth in claim 12, further comprising a conductive bar positioned within the hollow interior of the plunger, the conductive bar selectively movable into contact with the switch terminals.

18. A push-button switch comprising:
a body defining a first end, a second end, a hollow interior, and opposing walls positioned within the hollow interior, one of the opposing walls defining a pocket or slot,
a base mounted to the first end of the body,
a plurality of switch terminals mounted to the base,
a button operatively connected to the body at the second end,
a resilient member positioned between the button and the body,
a transparent plunger mounted to the button, the plunger defining a hollow interior and a projecting member extending outwardly from the plunger, the hollow interior of the plunger adapted to receive a hall-effect magnet, and adapted to receive a conductive bar,
a tactile feedback mechanism positioned between the base and the plunger,
a light emitting diode removably mounted to the base and operatively connected to light-emitting diode terminals, and
a light-emitting diode lens positioned within the hollow interior of the body and operatively coupled to the light-emitting diode.

19. The push-button switch as set forth in claim 18, further comprising a hall-effect magnet positioned within the hollow interior of the plunger and a hall-effect chip positioned within the base and operatively connected to the switch terminals.

20. The push-button switch as set forth in claim 19, further comprising a conductive bar positioned within the hollow interior of the plunger, the conductive bar selectively movable into contact with the switch terminals.

21. The push-button switch as set forth in claim 19, further comprising a cam mounted between the opposing walls of the body, the cam defining a cam track, wherein the projecting member extends through the slot and into engagement with the cam track.

* * * * *